(12) United States Patent
Prenat et al.

(10) Patent No.: US 8,443,318 B2
(45) Date of Patent: May 14, 2013

(54) METHOD FOR MODELING A MAGNETIC TUNNEL JUNCTION WITH SPIN-POLARIZED CURRENT WRITING

(75) Inventors: Guillaume Prenat, Grenoble (FR); Wei Guo, Grenoble (FR)

(73) Assignees: Commissariat a l'Energie Atomique et aux Energies Alternatives, Paris (FR); Centre National de la Recherche Scientifique, Paris (FR)

(*) Notice: Subject to any disclaimer, the term of this patent is extended or adjusted under 35 U.S.C. 154(b) by 223 days.

(21) Appl. No.: 12/809,991

(22) PCT Filed: Dec. 16, 2008

(86) PCT No.: PCT/EP2008/067677
§ 371 (c)(1),
(2), (4) Date: Nov. 20, 2010

(87) PCT Pub. No.: WO2009/080636
PCT Pub. Date: Jul. 2, 2009

(65) Prior Publication Data
US 2011/0055794 A1    Mar. 3, 2011

(30) Foreign Application Priority Data
Dec. 21, 2007 (FR) ...................... 07 09049

(51) Int. Cl.
*G06F 9/455* (2006.01)
*G06F 17/50* (2006.01)
(52) U.S. Cl.
USPC ............. 716/107; 716/106; 716/136; 703/14; 365/158; 365/161; 365/171; 365/173
(58) Field of Classification Search ............. 716/106, 716/107, 136; 703/14; 365/158, 161, 171, 365/173
See application file for complete search history.

(56) References Cited

U.S. PATENT DOCUMENTS

| | | |
|---|---|---|
| 2005/0216244 A1 | 9/2005 | Nahas |
| 2007/0064475 A1* | 3/2007 | Chen ............................ 365/171 |
| 2008/0259508 A2* | 10/2008 | Kent et al. ................. 360/324.11 |

OTHER PUBLICATIONS

"Micromagnetic simulations of current-induced magnetization switching in Co/Cu/Co nanopillars", by Z. H. Xiao, X. Q.. Ma, P. P. Wu, J. X. Zhang, L. Q. Chen. , S. Q. Shi, Journal of Applied Physics, Nov. 6, 2007.*
"Spin-transfer torque switching in magnetic tunnel junctions and spin-transfer torque random access memory", Zhitao Diao, Zhanjie Li, Shengyuang Wang, Yunfei Ding, Alex Panchula,Eugene Chen, Lien-Chang Wang and Yiming Huai, Journal of Physics: Condensed Matter, Apr. 6, 2007.*

* cited by examiner

*Primary Examiner* — Nha Nguyen
(74) *Attorney, Agent, or Firm* — Baker Hostetler LLP

(57) ABSTRACT

The junction comprising a stack of at least two magnetic layers, a first layer, for example a soft magnetic layer with controllable magnetization, and a second layer, for example a hard magnetic layer with fixed magnetization, the magnetization of the soft layer being described by a uniform magnetic moment, the dynamic behavior of the junction being modeled by an equivalent electrical circuit comprising at least two coupled parts: a first part representing the stack of the layers, through which a current flows corresponding to the polarized current flowing through said layers whose resistance across its terminals depends on three voltages representing the three dimensions of the magnetic moment along three axes, modeling the tunnel effect; a second part representing the behavior of the magnetic moment, comprising three circuits each representing a dimension of the magnetic moment by the three voltages, each of the three voltages depending on the voltages in the other dimensions and on the voltage across the terminals of the stack, modeling the torque effect exerted by the polarized current on the magnetization of the soft layer.

8 Claims, 3 Drawing Sheets

METHOD FOR MODELING A MAGNETIC TUNNEL JUNCTION WITH SPIN-POLARIZED CURRENT WRITING

CROSS-REFERENCE TO RELATED APPLICATIONS

This application is a National Stage of International Patent Application No. PCT/EP2008/067677, filed on Dec. 16, 2008, which claims priority to foreign Patent Application No. FR 07 09049, filed on Dec. 21, 2007, the disclosures of which are incorporated herein by reference in their entirety.

BACKGROUND OF THE INVENTION

Field of the Invention

The present invention relates to a method for modeling a magnetic tunnel junction with spin-polarized current writing.

Magnetic Tunnel Junctions (MTJs) are the basic components of the memories referred to as magnetic memories or MRAM, acronym for "Magnetic Random Access Memory". Currently, MTJs with spin-polarized current writing, also known as CIMS, acronym for "Current Induced Magnetic Switching", allow improved performances to be obtained with regard to integration density and power consumption.

The memory effect of these components notably uses the spin of the electrons as an additional degree of freedom with respect to conventional electronics on silicon which only use the charge of the electrons. The spin is the magnetic moment of an electron, and it can take two states: parallel to or opposing the ambient magnetic field.

The spin has a significant influence on the transport properties in ferromagnetic (FM) materials. This effect is notably responsible for giant magnetoresistance phenomena used in spin-valves and for the tunneling magnetoresistance (TMR) used in magnetic tunnel junctions (MTJs).

MTJs are nanostructures formed from two ferromagnetic layers separated by a layer of oxide. In this configuration, the resistance of the stack depends on the relative magnetization of the two FerroMagnetic layers. This is the tunneling magnetoresistance (TMR) effect. Usually, the magnetization of one of the layers, known as Hard Layer, is fixed and serves as a reference. The stability of this layer may be ensured by its shape or by exchange energy with an Anti-FerroMagnetic layer. The magnetization of the other layer is controllable. The value of the resistance, which depends on the angle between the magnetization of the free layer and of the reference layer, then codes the information contained in the junction.

Reading the information then consists in measuring the resistance of the junction. Writing in a junction consists in modifying the magnetic orientation of the soft layer in order to change the value of resistance of the stack. This action can be carried out in various ways, corresponding to various generations of MTJ, such as the following generations: FIMS for "Field Induced Magnetic Switching", TAS for "Thermally-Assisted Switching" or CIMS for "Current-Induced Magnetic Switching".

All these components, and particularly those of the third generation CIMS, are complex to design owing to the complex behaviors to be studied which depend on multiple physical, electrical or environmental factors. One means of study and industrial design, which is reliable and reproducible, is simulation. Several methods allow the physical behavior of these new components to be simulated. In order to simulate the behavior of such components within electronic circuits containing other components, equivalent electrical models must be used which will be able to be used in standard electrical simulators of the SPICE type.

For this purpose, the invention provides an equivalent electrical circuit allowing a component, notably of the CIMS MTJ type, whose parameters are known, to be easily simulated by means of an electrical simulator as would be carried out for any other conventional electronic component. The MTJs thus described can be inserted into circuits containing other components in order to be able to simulate complex architectures containing the magnetic components and, as the case may be, conventional microelectronics components. The model is furthermore controllable. Thus, the physical laws can easily be changed or made more precise as a function of the development of the physical models of MTJs, without modifying the equivalent circuit diagram. In addition, the parameters of the model can be described outside of the software code, allowing a user or a designer to input his own MTJ parameters according to his own characterizations.

SUMMARY OF THE INVENTION

The subject of the invention is therefore a method for modeling a magnetic tunnel junction with spin-polarized current writing, said junction comprising a stack of at least two magnetic layers separated by an insulating layer, a first magnetic layer and a second magnetic layer, the magnetization M of the first layer being described by a uniform magnetic moment $(m_x, m_y, m_z)$, the dynamic behavior of the junction being modeled by a equivalent electrical circuit comprising at least two coupled parts:

a first part representing the stack of the layers, through which a current $I_{ss}$ flows corresponding to the polarized current flowing through said layers, whose resistance across its terminals depends on three voltages $V_x, V_y, V_z$ representing the three dimensions of the magnetic moment along three axes $\vec{e}_x, \vec{e}_y, \vec{e}_z$, modeling the tunnel effect, in other words the effect of the magnetic state of the junction on its resistance;

a second part representing the behavior of the magnetic moment, comprising three circuits each representing a dimension of the magnetic moment by the three voltages $V_x, V_y, V_z$, each of the three voltages depending on the voltages in the other dimensions and on the voltage $V_{ss}$ across the terminals of the stack, modeling the torque effect exerted by the polarized current $I_{ss}$ on the magnetization of the first layer.

The first layer is for example a soft magnetic layer, with controllable magnetization, and the second layer is for example a hard magnetic layer, with fixed magnetization.

In one particular embodiment, the first part comprises, in parallel, a capacitor of constant value and a variable resistance depending on the three voltages $V_x, V_y, V_{ss}$ representing the magnetic moment of the first layer, for example the soft layer.

Each circuit of the second part comprises for example, in parallel, two current sources, a capacitor and a variable resistance, a first source of current being a function of the voltages in the other two dimensions, a second source of current being a function of the three voltages $V_x, V_y, V_{ss}$ and of the voltage $V_{ss}$ across the terminals of the stack.

Thus, the first circuit through which a current $I_x$ flows comprises for example, in parallel:

a current source of value $I_{xx}$ being a function of the voltages $V_y, V_z$ a current source of value $I_{xx}^{ST}$ being a function of the voltages $V_x, V_y, V_z, V_{ss}$ a capacitor a variable resistance expressed by its conductance $G_{xx}$ being a function of the voltages $V_y, V_z$;

the second circuit, through which a current $I_y$ flows:

a current source of value $I_{yy}$ being a function of the voltages $V_x, V_z$ a current source of value $I_{yy}^{ST}$ being a function of the voltages $V_x, V_y, V_z, V_{ss}$ a capacitor a variable resistance expressed by a conductance $G_{yy}$ being a function of the voltages $V_x, V_z$;

the third circuit, through which a current $I_z$ flows:

a current source of value $I_{zz}$ being a function of the voltages $V_x, V_y$ a current source of value $I_{zz}^{ST}$ being a function of the voltages $V_x, V_y, V_z, V_{ss}$ a capacitor a variable resistance expressed by its conductance $G_{zz}$ being a function of the voltages $V_x, V_y$;

The voltages $V_x, V_y, V_z$ are respectively the voltages representative of the dimensions $m_x, m_y, m_z$, and $V_{ss}$, the voltage across the terminals of the stack, the currents $I_{xx}^{ST}, I_{yy}^{ST}, I_{zz}^{ST}$ depending on the voltage $V_{ss}$.

Advantageously, the electrical circuit may be coupled with an equivalent circuit modeling the heat transfers within the device, each layer being modeled by a thermal resistance and a heat capacity.

Each layer of the stack being represented by an additional node, the capacitances and the resistances are for example connected in series, the capacitances being connected in parallel to a current source representing the heat flow.

BRIEF DESCRIPTION OF THE DRAWINGS

Other features and advantages of the invention will become apparent with the aid of the description that follows, presented with regard to the appended drawings which show.

DETAILED DESCRIPTION

Figure 1:
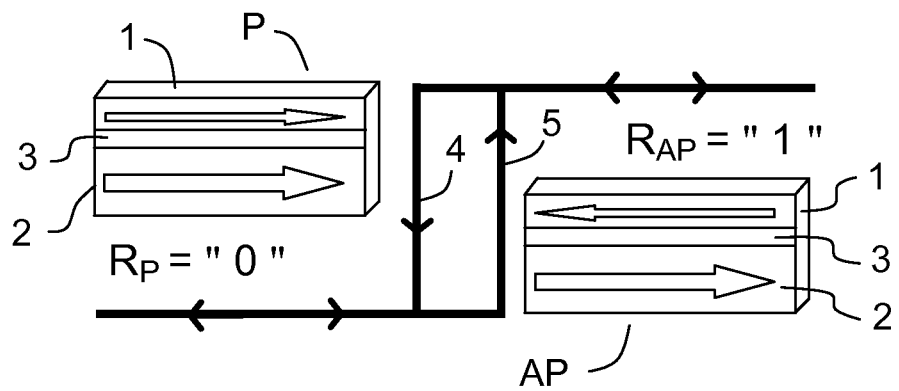
FIG. 1, an illustration of the tunnel effect in a tunnel junction.

FIG. 1 illustrates the effect of tunneling magnetoresistance in a magnetic tunnel junction MTJ. The latter is a nanostructure composed of two ferromagnetic layers 1, 2 separated by an insulating layer 3, for example a layer of oxide. The magnetization of one of the layers 2 is fixed; this is the hard layer. The magnetization of the other layer 1, soft layer, is controllable. The electrical resistance $R_P, R_{AP}$ of the stack of the layers 1, 2, 3 then depends on the magnetic orientation of the two layers. As previously indicated, this is the tunneling magnetoresistance effect. The passage from a parallel magnetization P between the two layers 1, 2 to an antiparallel magnetization AP exhibits hysteresis 4, 5. The value of the resistance, $R_P=0$ in the case of a parallel magnetization and $R_{AP}=1$ in the case of an antiparallel magnetization, codes and stores the information.

In FM materials, there exists a magneto-crystalline anisotropy due to the interactions between the magnetic moment and the crystal lattice. This results in a direction referred to as easy magnetization direction in which the magnetization naturally aligns in the absence of external forces. To this crystalline anisotropy is added a shape anisotropy in this case dependant on the shape of the junction. For example, if a junction of oval shape is used, the shape anisotropy tends to align the magnetization along the longest axis of the junction. If the magneto-crystalline easy magnetization axis is oriented in this same direction, the effects are added and a high stability of the junction is thus obtained.

Reading the information then consists in measuring the resistance of the junction. This reading operation can be effected by biasing the junction at a given voltage and by measuring the resulting current, for example by an amplifier circuit which regenerates the current in the form of a logic level corresponding to the stored binary information.

Writing in a junction consists in modifying the magnetic orientation of the soft layer 1 so as to change the resistance value of the stack 1, 2, 3. This action may be carried out in various ways, corresponding to various generations of MTJ:

in the first generation called FIMS for "Field Induced Magnetic Switching", the magnetization of the soft layer is modified by application of a magnetic field generated by a current line in the vicinity of the junction. In this approach, the current densities required for writing are generally significant and the field generated for writing in a junction can interact with a neighboring junction which can pose problems of selectivity during the writing operation;

in a second generation called TAS for "Thermally-Assisted Switching", the writing principle is similar except that a current is applied across the junction prior to writing in such a manner as to substantially reduce the field to be applied to the junction for writing. The electrical current density required is therefore much lower and the selectivity problems no longer exist, the junction to be written being the only one heated and hence the only one sensitive to the applied magnetic field;

the third generation, called CIMS for "Current Induced Magnetic Switching", does not use an external write line, but actually a sufficiently high spin-polarized current applied across the junction that exerts a torque on the magnetization of the soft layer which is capable of reversing the latter. The current densities required for writing are then very low and the selectivity problems non-existent. In addition, the absence of write current lines allows an ultimate integration to be achieved which is particularly advantageous for an application in the framework of devices requiring a high integration density as is notably the case for memories.

In order to be able to be simulated in an electrical simulator, a component is notably described in the form of a matrix known as a Jacobian matrix. For certain simulators, a component containing n nodes is described by its Jacobian matrix. A vector $I=[I_1, I_2 \ldots I_n]$ and a vector $V=[V_1, V_2 \ldots V_n]$ respectively describe the values of the currents entering and of the voltages present on each node k of the component. Each current $I_k$ has a static contribution $i_k$ and a dynamic contribution $$\frac{\partial q_k}{\partial t},$$

$q_k$ being the electric charge present on the node. The Jacobian matrix of the component is the sum of its conductance matrix G and of its capacitance matrix. An element of the conductance matrix $G_{i,j}$ is defined by the following equation:

$$G_{i,j} = \frac{\partial i_i}{\partial V_j}$$

$i_i$, $V_j$ being respectively the static current at a point i and the voltage at a point j.

An element of the capacitance matrix $C_{i,j}$ is defined by the following equation:

$$C_{i,j} = \frac{\partial q_i}{\partial V_j}$$

$q_i$, $V_j$ being respectively the static charge at a point i and the voltage at a point j.

The modeling of the component leads to an equivalent electrical circuit being defined for it then its Jacobian matrix being described which will then be used by a simulator in order to carry out the simulations in a continuous, transient or alternating mode, for example. The definition of an equivalent circuit is therefore an initial step that is necessary for the simulation.

The invention provides an equivalent electrical model, notably for MTJs of the CIMS type. This modeling is based on the physical models of MTJs. For these models, it is assumed that the magnetization of a ferromagnetic layer may be described by a single uniform magnetic moment.

In a crystal lattice, there exists a favored direction for the magnetization, referred to as easy axis and denoted $\vec{e}_y$ in the following. This direction represents a stable position that the magnetization takes in the absence of external forces. This phenomenon is due to the interaction between the magnetic moment and the crystal lattice which results in a magneto-crystalline anisotropy energy and an equivalent magneto-crystalline anisotropy field given in the following relationships:

$$E_k = K_u \sin^2(\theta_{msl}) \Leftrightarrow \vec{H}_k = \frac{2K_u}{\mu_0 M_s} m_y \vec{e}_y \qquad (1)$$

where $E_k$ is the magneto-crystalline anisotropy energy, $K_u$ is the uniaxial anisotropy constant, $\theta_{msl}$ is the angle between the magnetization and the easy axis $\vec{e}_y$, $\vec{H}_k$ is the magneto-crystalline anisotropy field, $\mu_0$ is the magnetic permeability of free-space, $M_s$ is the value of the saturation magnetization and $m_y$ is the coordinate along the easy axis of the normalized magnetization $\vec{m}$ such that $\vec{M} = M_s \vec{m}$.

In a ferromagnetic material, the finite size of a sample and the accumulations of charges are responsible for the appearance of a demagnetizing field $\vec{H}_d$. The expression for this field and for the corresponding energy $E_d$ are given in the following relationship:

$$\vec{H}_d = -[N]\vec{M} = -M_s \begin{bmatrix} n_x & 0 & 0 \\ 0 & n_y & 0 \\ 0 & 0 & n_z \end{bmatrix} \begin{bmatrix} m_x \\ m_y \\ m_z \end{bmatrix} \Leftrightarrow E_d = \frac{-\mu_0}{2} \vec{H}_d \cdot \vec{M} \qquad (2)$$

The Zeeman energy represents the energy of a magnetization $\vec{M}$ in an applied magnetic field $\vec{H}_a$. This energy $E_z$ is given by the following relationship:

$$E_z = -\mu_0 \vec{H}_a \cdot \vec{M} \Leftrightarrow -\mu_0 H_a M_s \cos(\theta) \qquad (3)$$

where $\theta$ is the angle between the vectors $\vec{H}_a$ and $\vec{M}$.

The tunneling magnetoresistance TMR is the relative variation in resistance between the states of parallel P and antiparallel AP magnetization, defined by the following relationship (4). The relative variation in resistance $R(\theta)$ as a function of the angle $\theta$ between the magnetizations of the hard and soft layers of the stack is given by the following relationship (5). The variation in conductance $G(\theta)$ is then given by the relationship (6). It should be noted that there exist several possible models for describing the variation in conductance of the stack as a function of the magnetic state. However, this does not change anything for the structure of an equivalent circuit according to the invention which will be described in the following. The following equations (4), (5), (6) are therefore given by way of example:

$$TMR = \frac{R_{AP} - R_P}{R_P} = \frac{\Delta R}{R_P} \qquad (4)$$

$$R(\theta) = R_P + \frac{\Delta R}{2}(1 - \cos(\theta)) \qquad (5)$$

$$G(\theta) = \frac{G_P}{1 + \frac{TMR}{2}(1 - \cos(\theta))} \qquad (6)$$

$G_P$ being the value of the parallel conductance.

This value can be modeled according to various models. The Simmons model gives a constant value for the parallel conductance, valid for a low bias voltage. Its value is given by the following equation:

$$G_P = G_{P_0} = k_0 k_1 A \frac{\sqrt{\Phi}}{2t_{ox}} e^{-k_1 t_{ox} \sqrt{\Phi}} \qquad (7)$$

where $$k_0 = \frac{e^2}{2\pi h} \text{ and } k_1 = \frac{4\pi\sqrt{(2m_e e)}}{h}$$

e being the electrical charge on a electron, $m_e$ its mass, h Planck's constant and $\Phi$ the height of the potential barrier at the interface.

The Brinkmann, Dynes and Rowell model gives the variation of the parallel conductance as a function of the bias voltage $V_{ss}$, defined according to the following relationship:

$$G_P(V_{ss}) = G_{P_0}(1 - 2\beta V_{ss} + 3\delta V_{ss}^2) \qquad (8)$$

where $$\beta = \frac{e\sqrt{(2m_e)}\, t_{ox} d\Phi}{24\hbar\Phi^{\frac{3}{2}}} \text{ and } \delta = \frac{e^2 m_e t_{ox}^2}{12\hbar\Phi}$$

d$\Phi$ being the asymmetry of the potential barrier and $t_{ox}$ being the thickness of the oxide layer 3.

The TMR also depends on the bias voltage according to the following equation:

$$TMR(V_{ss}) = \frac{TMR_0}{1 + \frac{V_{ss}^2}{V_h^2}} \quad (9)$$

where $TMR_0$ is the value of the TMR for low bias voltages and $V_h$ is defined by $$TMR(V_h) = \frac{TMR_0}{2}$$

The final expression for the conductance G as a function of the angle θ and of the bias voltage $V_{ss}$ is given by the following equation:

$$G(\theta, V_{ss}) = G_{P_0} \frac{1 - 2\beta V_{ss} + 3\delta V_{ss}^2}{1 + \frac{1 - \cos(\theta)}{2} \frac{TMR_0}{1 + \frac{V_{ss}^2}{V_h^2}}} \quad (10)$$

The dynamic behavior of a magnetization $\vec{M}$ subjected to an effective magnetic field $\vec{H}_{\mathit{eff}}$, sum of the applied field, the magneto-crystalline anisotropy field and the shape anisotropy field, is described by the Landau-Liftschitz-Gilbert (LLG) equation hereinbelow:

$$\frac{\partial \vec{m}}{\partial t} = -\gamma \mu_0 (\vec{m} \times \vec{H}_{\mathit{eff}}) + \alpha \cdot \vec{m} \times \frac{\partial \vec{m}}{\partial t} \quad (11)$$

where $$\gamma = \frac{g \cdot e}{2m_e}$$

is a gyroscopic factor, g being the Lande factor close to 2 for an electron, and α is the damping term. This equation (11) presents the Gilbert form of the LLG equation.

Another formulation, called the Landau-Liftschitz form is equivalent; it is given by the equation hereinbelow:

$$\frac{\partial \vec{m}}{\partial t} = \frac{-\gamma\mu_0}{1+\alpha^2}(\vec{m} \times \vec{H}_{\mathit{eff}}) - \alpha \frac{\gamma\mu_0}{1+\alpha^2} \vec{m} \times (\vec{m} \times \vec{H}_{\mathit{eff}}) \quad (12)$$

Figure 2:
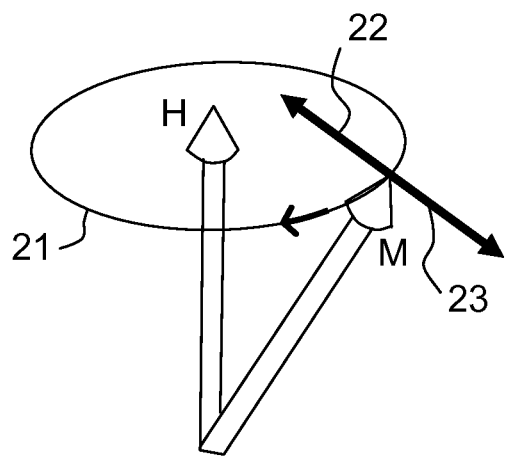
FIG. 2, an illustration of the torques acting on a magnetization subjected to a magnetic field.

FIG. 2 illustrates the torques acting on a magnetization subjected to a magnetic field described by the preceding equations. The first term of the sum of the second members of the equations (11) and (12) describes the precession 21 representing the tendency of the magnetization M to gyrate around the magnetic field H and the second term of the sum describes the damping 22 representing the losses finally responsible for the alignment of the magnetization in the direction of the applied magnetic field. In order to take into account the torque effect, called STT for Spin Torque Transfer, a spin torque term 23 $\Gamma_{ST}$ should be added as described by the following relationship:

$$\Gamma_{ST} = -\gamma\mu_0 a_J(\theta) I_{ss} \vec{m} X (\vec{m} X \vec{p}) \quad (13)$$

with $$a_J(\theta) = \frac{\hbar \cdot g(\theta)}{2e \cdot t_{sl} \mu_0 M_s S} \text{ and } g(\theta) = \frac{1}{-4 + \left(P^{\frac{1}{2}} + P^{\frac{1}{2}}\right)\frac{3+\cos(\theta)}{4}}$$

$\vec{p}$ is a unitary vector whose direction is that of the magnetization of the hard layer used to polarize the current. $I_{ss}$ is the current flowing through the stack from the hard layer 2 toward the soft layer 1, $t_{sl}$ is the thickness of the soft layer and P is the spin polarization of each of the magnetic layers 1, 2. The expression for g as a function of the angle θ can change according to the models without changing the equivalent circuit. The spin torque term 23 acts as a torque which, depending on the direction of the current, may add to or oppose the damping term 22. If this torque opposes the damping, as illustrated in FIG. 2, and if its value is greater than that of the damping, it is possible to make the magnetization switch. If the two terms have comparable values, it is possible to cancel the damping and to obtain sustained oscillations. It is the latter phenomenon that is used for example in the framework of the radio-frequency (RF) oscillators based on MTJs.

The tunneling conductance also varies as a function of temperature. The variation of the conductance for a low bias voltage as a function of the temperature T is given by the following relationship:

$$G(T, V=0) = G_{00} \frac{\gamma_0 T}{\sin(\gamma_0 T)} \quad (14)$$

where $$\gamma_0 = \frac{\pi \cdot k \cdot t_{ox}}{\hbar} \sqrt{\frac{2m_e}{e\Phi}},$$

k being Boltzmann's constant and $G_{00}$ the conductance at low temperature and low bias voltage, the other parameters having been previously defined.

To this conductance depending on the spin, called elastic conductance, must be added the inelastic conductance independent of the spin, such that: $G(V,T) = G_{elastic}(V,T) + G_{inelastic}(V,T)$ with $G_{inelastic}(V,T) = \tau_N T^{\beta(N)}$ N is the number of states that an electron occupies during its passage across the tunnel barrier, $$\beta(N) = N - \frac{2}{N+1},$$

and $\tau_N$ is a parameter proportional to the density and to the radius of the localized states involved in the barrier.

As far as the polarization P is concerned, this varies as a function of the temperature T according to the following relationship:

$$P(T) = P_0(1 - BT^{\frac{3}{2}}) \quad (15)$$

where $P_0$ is the polarization at low temperature and B a parameter essentially depending on the material and on the thickness of the electrodes.

Starting from the previous equations, it is possible to calculate the expressions for the various parameters, notably the conductances in the P state and in the AP state, the TMR, the saturation magnetization $M_s$, as a function of temperature.

The propagation of heat in an isotropic and homogeneous material, along an axis x and as a function of time, is described by a conventional equation:

$$\frac{\partial^2 T}{\partial^2 x} = \frac{c\rho}{\lambda_{th}} \frac{\partial T}{\partial t} \quad (16)$$

c being the heat capacity of the material, $\rho$ its density and $\lambda_{th}$ the specific thermal conductivity. The equation (16) is valid for a given material. It is notably valid for each layer 1, 2, 3 of the stack but with thermal parameters specific to each layer.

The invention provides an electrical model equivalent to the physical models previously described. In this model, the physical quantities are all described by image voltages and currents. Thus, for example, the three coordinates of the magnetic moment, $m_x$, $m_y$, $m_z$ are represented by voltages $V_x$, $V_y$, $V_z$. The equivalent electrical model contains two external nodes representing the ends of the stack 1, 2, 3 and three internal nodes representing the coordinates of the magnetic moment. The circuits are composed of capacitors, resistors or generators, of voltage or of current, whose values could be voltage-controlled. This effect of voltage on the value of some components of the circuit corresponds to the dependencies of the parameters as a function of the quantities involved in the description of the MTJ of the CIMS type. Where several models are possible for describing a dependency, only the expression for one of the controlled components is modified, but the equivalent circuit diagram remains the same.

An equivalent electrical circuit according to the invention is a generic approach for describing a circuit. Such an equivalent circuit allows a component whose parameters are known to easily be simulated using an electrical simulator exactly as would be done for any other electronic component. The elements of the voltage-controlled circuit represent the effect of certain quantities on the parameters of the circuit. The expression of these components as a function of the voltage can easily be modified according to the physical model chosen for the description of the component. The invention therefore allows a very controllable approach since the physical laws are described by the expression of the values of the components and can easily be changed or rendered more precise according to the development of the physical models of MTJs, without modifying the equivalent circuit diagram.

Figure 3:
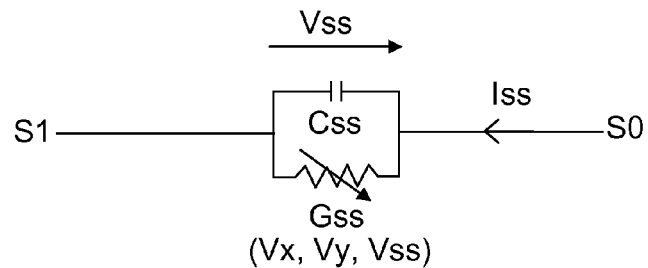
FIG. 3, an equivalent circuit diagram of the tunnel effect depending on the spin.

FIG. 3 illustrates the equivalent circuit diagram of the tunnel effect depending on the spin. The two external nodes $S_0$, $S_1$ represent the ends of the stack. The conductance $G_{ss}$ of the stack can be described by the Julliere model expressed by the relationship (10). To this conductance is added the capacitance $C_{ss}$ of the stack, $$C_{ss} = S \frac{\varepsilon_0 \varepsilon_R}{t_{ox}}$$

where $\varepsilon_0$, $\varepsilon_R$ are the free-space dielectric permittivity and the relative permittivity of the oxide layer 2, $t_{ox}$ being, as previously, the thickness of this layer 2. It should be noted that in the circuit diagram in FIG. 3 the conductance of the stack is described by a voltage-controlled conductance $G_{ss}$, notably allowing a conductance to be modeled depending on voltages present in the circuit. This is for example used in the case of a transistor whose small-signal output conductance depends on the bias voltage. The expression for the conductance as a function of the voltage $V_{ss}$ is given by the relationship (10), this represents the effect of the magnetic moment on the resistance of the stack. $V_{ss}$ is the voltage across the terminals of the stack.

The dynamic behavior of the magnetization of the soft layer is described by the LLG equation with the spin torque term according to the relationship (17) hereinbelow:

$$\frac{\partial \vec{m}}{\partial t} = -\gamma \mu_0 (\vec{m} \times \vec{H}_{eff}) + \alpha.\vec{m} \times \frac{\partial \vec{m}}{\partial t} - \gamma \mu_0 a_J(\theta) I_{ss} \vec{m} \times (\vec{m} \times \vec{p}) \quad (17)$$

In this relationship, the spin torque term $\Gamma_{sT}$ from the relationship (13) is to be added to the Gilbert form of the LLG equation described by the relationship (11). Other approaches are possible, such as for example adding this spin torque term to the Landau-Liftschitz form of the relationship (12). It is also possible to add a further term referred to as "field-like term". In this case again, the equivalent circuit is not changed but only the value of its components.

If the equation (17) is projected onto the three space axes, three scalar differential equations are obtained of the same type as the equation (18) hereinbelow, for example:

$$\frac{\partial m_x}{\partial t} + \alpha_m \frac{\gamma_0}{1+\alpha^2} \left[ (n_x - n_y) M_s m_y^2 + (n_x - n_z) M_s m_z^2 + \frac{2K_u}{\mu_0 M_s} m_y^2 \right] m_x =$$
$$\frac{\gamma_0}{1+\alpha^2} m_y m_z \left[ (n_z - n_y) M_s + \frac{2K_u}{\mu_0 M_s} \right] -$$
$$\frac{\gamma_0}{1+\alpha^2} a_J I_{ss}(V_{ss}, m_x, m_y)[\cos(\theta_{mhl})(m_x m_y + \alpha.m_z) + \sin(\theta_{msl})(m_y^2 + m_z^2)]$$

This equation (18) represents the projection of the LLG equation onto the axis $\vec{e}_x$, carrying the component $m_x$ of the magnetic moment, perpendicular to the easy axis $\vec{e}_y$ previously discussed for the relationship (1). $\theta_{msl}$ is the angle between the magnetization and the easy axis $\vec{e}_y$ and $\theta_{mhl}$ is the angle between the magnetization and the axis $\vec{e}_x$.

The following equivalent electrical equation (19) is then obtained:

$$C_x \frac{\partial V_x}{\partial t} + G_{xx}(V_x, V_y) V_x = I_{xx}(V_x, V_y) + I_{xx}^{ST}(V_x, V_y, V_{ss}) \quad (19)$$

where:
$C_x = 1$ $$G_{xx}(V_x, V_y) = \alpha_m \frac{\gamma_0}{1+\alpha^2}\left[(n_x - n_y)M_s V_y^2 + (n_x - n_z)M_s V_z^2 + \frac{2K_u}{\mu_0 M_s}V_y^2\right]$$

$$I_{xx}(V_x, V_y) = -\frac{\gamma_0}{1+\alpha^2}V_y V_z\left[(n_z - n_y)M_s + \frac{2K_u}{\mu_0 M_s}\right]$$

$$I_{xx}^{ST}(V_x, V_y, V_z) =$$
$$-\frac{\gamma_0}{1+\alpha^2}a_J I_{ss}(V_{ss}, V_x, V_z)[\cos(\theta_{mhl})(V_x V_y + \alpha V_z) + \sin(\theta_{msl})(V_y^2 + V_z^2)]$$

$V_x$, $V_y$ et $V_z$ are of the voltages representing, respectively, $m_x$, $m_y$ and $m_z$. $V_{ss}$ is the voltage across the terminals $S_0$, $S_1$ of the stack 1, 2, 3. The capacitance $C_x$ is for example constant and equal to 1 farad. $G_{xx}$ a voltage-controlled conductance, $I_{xx}$ and $I_{xx}^{ST}$ are voltage-controlled current sources, $I_{xx}^{ST}$ notably depending on the voltage across the terminals of the stack $V_{ss}$, thus representing the influence of the current flowing through the stack (and hence of the voltage across its terminals) on the coordinates of the magnetic moment. Equations similar to the equation (19) are obtained for the other axes $\vec{e}_y$ and $\vec{e}_z$. $C_x$, $G_{xx}$, $I_{xx}$, $I_{xx}^{ST}$ are then respectively replaced by $C_y$, $G_{yy}$, $I_{yy}$, $I_{yy}^{ST}$ and $C_z$, $G_{zz}$, $I_{zz}$, $I_{zz}^{ST}$, the indices of the other parameters in the equations being obtained by circular permutation over x, y, z, and lastly $C_y = 1$ and $C_z = 1$.

Figure 4:
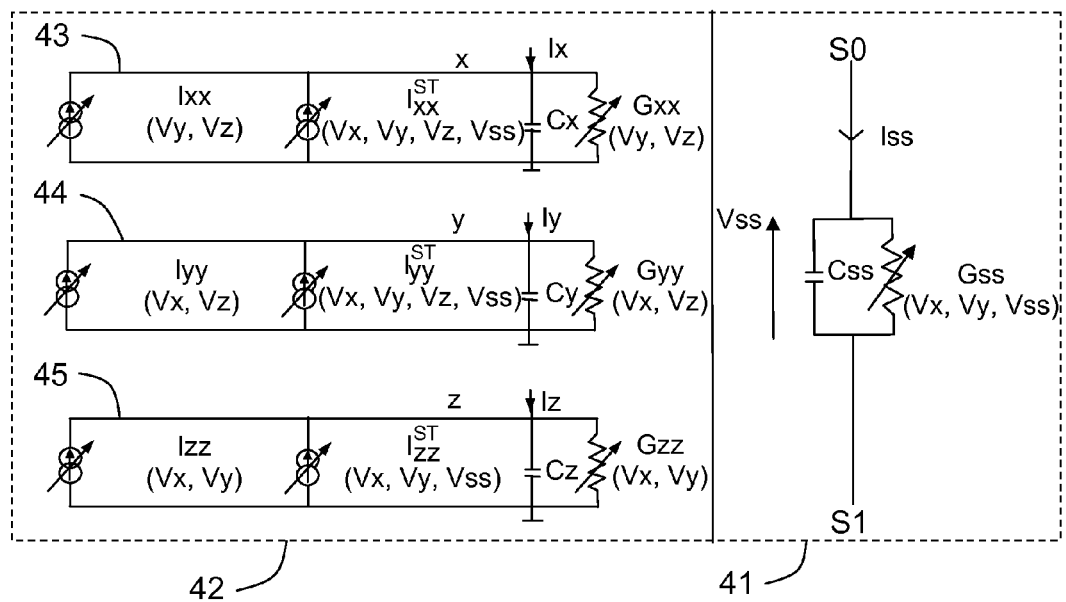
FIG. 4, an example of equivalent circuit used by the modeling method according to the invention.

The equivalent circuit in FIG. 4 describes the magnetic behavior of the soft layer 1 in accordance with the preceding equations, notably the equation (19) along the axis $\vec{e}$, and the similar equations along the other axes $\vec{e}_y$ and $\vec{e}_z$.

The Jacobian matrix of this equivalent circuit is given by the following table:

|  | $Vs_0$ | $Vs_1$ | Vx | Vy | Vz |
|---|---|---|---|---|---|
| $Is_0$ | $G_{ss}$ | $-G_{ss}$ | $G_{sx}$ | $G_{sy}$ | 0 |
| $Is_1$ | $-G_{ss}$ | $G_{ss}$ | $-G_{sx}$ | $-G_{sy}$ | 0 |
| Ix | $G_{xs}$ | $-G_{xs}$ | $G_{xx}$ | $G_{xy}$ | $G_{xz}$ |
| Iy | $G_{ys}$ | $-G_{ys}$ | $G_{yx}$ | $G_{yy}$ | $G_{yz}$ |
| Iz | $G_{zs}$ | $-G_{zs}$ | $G_{zx}$ | $G_{zy}$ | $G_{zz}$ |

This matrix is obtained by deriving the currents entering each node of the circuit with respect to the voltages present on each node. $G_{ss}$ represents the conductance of the stack, $G_{xx}$, $G_{xy}$, $G_{xz}$, $G_{yx}$, $G_{yy}$, $G_{yz}$, $G_{zx}$ and $G_{zz}$ represent the behavior in three dimensions of the magnetization of the soft layer, $G_{sx}$ and $G_{sy}$ the influence of the coordinates of the magnetic moment on the resistance of the stack and $G_{xs}$, $G_{ys}$ and $G_{zs}$ the spin torque effect, in other words the effect of the current flowing across the junction on the magnetic state.

FIG. 4 shows that the model is formed starting from conventional electrical components, such as notably capacitances $C_x$, $C_y$, $C_z$, $C_{ss}$, conductances $G_{xx}$, $G_{yy}$, $G_{zz}$, $G_{ss}$ and current source $I_{xx}$, $I_{yy}$, $I_{zz}$ $I_{xx}^{ST}$, $I_{yy}^{ST}$, $I_{zz}^{ST}$ which may be voltage-controlled in order to model the effect of certain quantities on certain parameters of the model.

More precisely, the model in FIG. 4 is composed of two parts 41, 42 representing the two physical phenomena involved in this type of junction.

A first part 41 similar to the circuit in FIG. 3, called electrical part, represents the magnetic stack. It comprises, in parallel, a capacitor of constant value equal to $C_{ss}$ and a resistance depending on three voltages representing the magnetic moment of the soft layer. The resistance is expressed by its conductance $G_{ss}$ being a function of the voltages $V_x$, $V_y$, $V_{ss}$.

This part 41 models the effect of tunneling magnetoresistance depending on the magnetization.

A second part 42, called magnetic moment, represents the behavior of the magnetic moment. This part contains three circuits 43, 44, 45 representing the three coordinates of the magnetic moment, represented by the three voltages $V_x$, $V_y$, $V_z$. These three voltages depend on the other voltages, as regards the dynamic behavior of the moment in three dimensions, and on the voltage across the terminals of the stack $S_0$, $S_1$, hence on the current $I_{ss}$ flowing through it, thus modeling the effect of spin torque, in other words the torque exerted by this polarized current on the magnetization of the soft layer.

Each circuit 43, 44, 45 comprises, in parallel, two current sources, a capacitor and a variable resistance. Thus, the first circuit 43, model along the axis $\vec{e}_x$, through which a current $I_x$ flows, comprises, in parallel:
  a current source of value $I_{xx}$ of the voltages $V_y$, $V_z$
  a current source of value $I_{xx}^{ST}$ function of the voltages $V_x$, $V_y$, $V_z$, $V_{ss}$
  a capacitor whose value is equal to $C_x$
  a variable resistance expressed by its conductance $G_{xx}$ being a function of the voltages $V_y$, $V_z$.

Similarly, the second circuit 44, model along the axe $\vec{e}_y$, through which a current $I_y$ flows, comprises, in parallel:
  a current source of value $I_{yy}$ being a function of the voltages $V_x$, $V_z$
  a current source of value $I_{yy}^{ST}$ being a function of the voltages $V_x$, $V_y$, $V_z$, $V_{ss}$
  a capacitor whose value is equal to $C_y$
  a variable resistance expressed by its conductance $G_{yy}$ being a function of the voltages $V_x$, $V_z$.

Lastly, the third circuit 45, model along the axis $\vec{e}_z$, through which a current $I_z$ flows, comprises, in parallel:
  a current source of value $I_{zz}$ being a function of the voltages $V_x$, $V_y$
  a current source of value $I_{zz}^{ST}$ being a function of the voltages $V_x$, $V_y$, $V_z$, $V_{ss}$
  a capacitor whose value is equal to $C_z$
  a variable resistance expressed by its conductance $G_{zz}$ being a function of the voltages $V_x$, $V_y$.

The currents $I_{xx}^{ST}$, $I_{yy}^{ST}$, $I_{zz}^{ST}$ depend on the voltage $V_{ss}$ of the electrical part representing the spin torque effect previously described.

Advantageously, this model is generic and the expression of the voltage-controlled components can be adapted to represent various models. This model is furthermore compatible with electrical simulators. Only the way of describing the circuit changes from one simulator to another, or from one description language to another.

Figure 5:
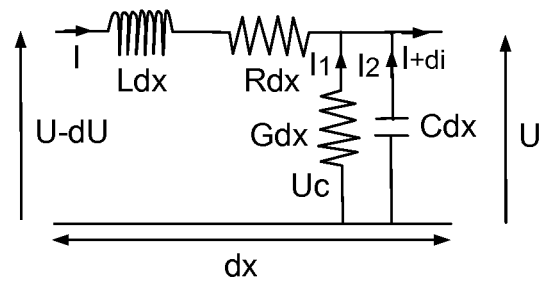
FIG. 5, a circuit diagram of a section of transmission line.

FIG. 5 illustrates the equivalent circuit diagram of a section of transmission line of length dx. A variant embodiment of the preceding model may be established by adding a modeling of the thermal effects. In particular, the combination of the TAS and CIMS effects allows the junctions to be improved. In this approach, the switching of the magnetization by spin-polarized current could notably be facilitated by prior heating of the junction. In order to describe the behavior of a junction of the TAS type, the evolution of the temperature of the junction must naturally be taken into account. For this purpose, the heat transfer equation (16) may be used. This equation is close to that for a transmission line. FIG. 5 shows the circuit diagram of a section of transmission line of length dx where L, R, C and G are, respectively, the inductance, the longitudinal resistance, the capacitance and the transverse conductance per unit of length of the line. The propagation equation of the line may be written in the form of the equation (20) hereinbelow, commonly known as the 'telegraphist's equation':

$$dV = -Ldx\frac{\partial i}{\partial t} - Ridx \Rightarrow \frac{\partial V}{\partial x} = -L\frac{\partial i}{\partial t} - Ri \quad (20)$$

$$di = i_1 + i_2 = -Cdx\frac{\partial V}{\partial t} - Gvdx \Rightarrow \frac{\partial i}{\partial x} = -C\frac{\partial V}{\partial t} - GV$$

$$\frac{\partial^2 V}{\partial^2 x} = LC\frac{\partial^2 V}{\partial^2 t} + (LG + RC)\frac{\partial V}{\partial t} + RGV$$

Figure 6:
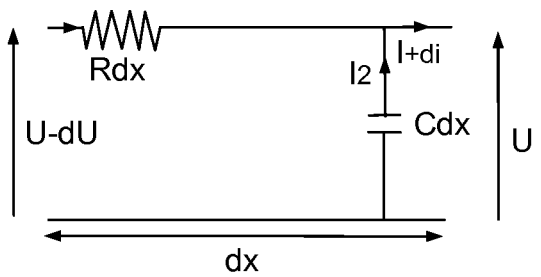
FIG. 6, an equivalent circuit diagram of the heat flow equation.

If a line is considered such that L=G=0, an equation similar to that of the heat equation where the capacitance C corresponds to the heat conductivity c, the resistance R corresponds to the quantity $$\frac{1}{\lambda_{th}},$$

the voltage U, V corresponds to the temperature T, and the current i corresponds to the heat flux p. The equivalent circuit diagram is illustrated in FIG. 6 obeying the following equation:

$$\frac{\partial^2 V}{\partial^2 x} = RD\frac{\partial V}{\partial t} \quad (21)$$

Figure 7:
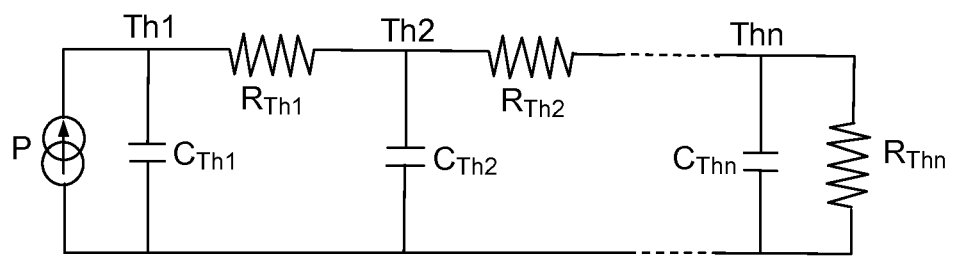
FIG. 7, an equivalent thermal diagram of the stack of the layers of a junction.

FIG. 7 illustrates an example of equivalent thermal circuit diagram of the stack. Theoretically, the heat capacities $C_{Th1}$, $C_{Th2}$, ... $C_{Thn}$ and the thermal resistances $R_{Th1}$ $R_{Th2}$, ... $R_{Thn}$ used in the model should be defined locally. However, in order to simplify the modeling, each layer of the stack is for example modeled by a thermal resistance and heat capacity characteristic of the layer. Thus, each layer of the stack may be represented by an additional node Th1, Th2, ... Thn. In FIG. 7, the circuits $C_{Thi}$, $R_{Thi}$ are connected in series, the capacitances $C_{Th1}$ $C_{Th2}$, ... $C_{Thi}$, ... $C_{Thn}$ being connected in parallel to a current source P representing the heat flow.

It is equally possible to use a single RC circuit with a single additional node and to evaluate the values of the resistance R and of the capacitance C by characterization of the stack.

It is also possible to act on the two magnetic layers 1, 2 of the stack. In the spin torque approach, one layer is considered as trapped and serves as a polarizer for the reference current. The other layer contains the useful signal. Interchanging the roles of the two layers may be envisioned, thus creating two configurations of the junction. The effect of the spin-polarized current on the magnetic state would then be opposite between these two configurations. From a software point of view, this change could easily be carried out by changing the sign of the spin torque term $\Gamma_{ST}$, $I_{xx}^{ST}$, $I_{yy}^{ST}$, $I_{zz}^{ST}$ in the equivalent circuit according to the desired configuration, still without changing the structure of the circuit. In this case, the value of the polarization $\vec{p}$ would no longer be a global constant, but could change during the operation while remaining however fixed as long as the system remains in a given configuration.

The invention claimed is:

1. A method for modeling a magnetic tunnel junction with spin-polarized current writing, said magnetic tunnel junction comprising a stack of at least two magnetic layers separated by an insulating layer, a first magnetic layer and a second magnetic layer, magnetization of the first magnetic layer being described by a uniform magnetic moment, dynamic behavior of the magnetic tunnel junction being modeled by an equivalent electrical circuit comprising at least two coupled parts, the method comprising:
   providing, by a computer processor, a first part representing the stack of at least two magnetic layers, through which a current flows corresponding to the spin-polarized current flowing through said stack of at least two magnetic layers, whose resistance across its terminals depends on three voltages representing three dimensions of magnetic moment along three axes, modeling a tunnel effect;
   providing, by the computer processor, a second part representing a behavior of the magnetic moment, comprising three circuits each representing a dimension of the magnetic moment by the three voltages, each of the three voltages depending on voltages in the other dimensions and on voltage across the terminals of the stack of at least two magnetic layers, modeling a torque effect exerted by the spin-polarized current on the magnetization of the first layer.

2. The method as claimed in claim 1, wherein the first magnetic layer is a soft magnetic layer, with controllable magnetization, and the second magnetic layer is a hard magnetic layer, with fixed magnetization.

3. The method as claimed in claim 1, wherein the first part comprises, in parallel, a capacitor of constant value and a variable resistance $1/G_{ss}$ depending on the three voltages representing the magnetic moment of the first magnetic layer.

4. The method as claimed in claim 1, wherein each of the three circuits of the second part comprises, in parallel, two current sources, a capacitor and a variable resistance, a first current source, being a function of the voltages in other two dimensions, a second current source, being a function of the three voltages of the three dimensions and of the voltage across the terminals of the stack of at least two magnetic layers.

5. The method as claimed in claim 4, wherein:
   a first of the three circuits, through which a current $I_x$ flows, comprises, in parallel:
      a current source of first value being a function of the voltages of two of the three dimensions,
      a current source of second value being a function of the voltages of the three dimensions and the voltage across the terminal of the stack of at least two magnetic layers,
      a capacitor,
      a variable resistance expressed by its conductance being a function of the voltages of two of the three dimensions;
   a second of the three circuits, through which a current $I_y$ flows, comprises, in parallel:
      a current source of third value being a function of the voltages of two of the three dimensions,
      a current source of fourth value being a function of the voltages of the three dimensions and the voltage across the terminal of the stack of at least two magnetic layers,
      a capacitor,
      a variable resistance expressed by a conductance being a function of the voltages of the two dimensions of the three dimensions;
   a third of the three circuits, through which a current flows, comprises, in parallel:

a current source of fifth value being a function of the voltages of two dimensions of the three dimensions, a current source of sixth value being a function of the voltages of the three dimensions and the voltage across the terminal of the stack of at least two magnetic layers, a capacitor, a variable resistance expressed by its conductance being a function of the voltages of two of the three dimensions.

6. The method as claimed in claim 5, wherein the value of the capacitor is constant.

7. The method as claimed in claim 1, wherein an electrical circuit is coupled with an equivalent thermal circuit, each layer being modeled by a thermal resistance and a thermal capacity.

8. The method as claimed in claim 7, wherein each layer of the stack of at least two magnetic layers being represented by an additional node, capacitance and resistances are connected in series, the capacitances being connected in parallel with a current source representing a heat flow.

* * * * *

UNITED STATES PATENT AND TRADEMARK OFFICE
CERTIFICATE OF CORRECTION

PATENT NO. : 8,443,318 B2  Page 1 of 1
APPLICATION NO. : 12/809991
DATED : May 14, 2013
INVENTOR(S) : Prenat et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 375 days.

Signed and Sealed this
Eighth Day of September, 2015

Michelle K. Lee
*Director of the United States Patent and Trademark Office*